(12) United States Patent
Ozard et al.

(10) Patent No.: US 10,305,437 B2
(45) Date of Patent: *May 28, 2019

(54) DOHERTY AMPLIFIER

(71) Applicant: Skyworks Solutions, Inc., Woburn, MA (US)

(72) Inventors: Kenneth Sean Ozard, Middlesex, NJ (US); Anthony Trujillo, Bethlehem, PA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/670,844

(22) Filed: Aug. 7, 2017

(65) Prior Publication Data

US 2018/0026593 A1     Jan. 25, 2018

Related U.S. Application Data (63) Continuation of application No. 13/710,765, filed on Dec. 11, 2012, now Pat. No. 9,742,365.

(60) Provisional application No. 61/576,243, filed on Dec. 15, 2011.

(51) Int. Cl.
| H03F 3/21 | (2006.01) |
| H03F 1/02 | (2006.01) |
| H03F 3/19 | (2006.01) |
| H03F 3/60 | (2006.01) |

(52) U.S. Cl.
CPC .......... *H03F 3/211* (2013.01); *H03F 1/0288* (2013.01); *H03F 3/19* (2013.01); *H03F 3/602* (2013.01); *H03F 2200/192* (2013.01); *H03F 2200/198* (2013.01); *H03F 2200/204* (2013.01); *H03F 2200/405* (2013.01); *H03F 2200/408* (2013.01); *H03F 2200/451* (2013.01); *H03F 2203/21106* (2013.01)

(58) Field of Classification Search
USPC .................. 330/124 R, 295, 84, 286, 53–54
See application file for complete search history.

(56) References Cited

U.S. PATENT DOCUMENTS

| 6,515,546 | B2 | 2/2003 | Liwinski | |
| 7,295,074 | B2* | 11/2007 | Wong | H03F 1/0288 330/124 R |
| 7,362,170 | B2* | 4/2008 | Louis | H03F 1/0288 330/124 R |
| 8,183,929 | B2 | 5/2012 | Grondahl | |
| 9,007,142 | B1 | 4/2015 | Ozard | |

* cited by examiner

*Primary Examiner* — Hieu P Nguyen
(74) *Attorney, Agent, or Firm* — Knobbe, Martens, Olson & Bear, LLP (57) ABSTRACT

A multistage linear power amplifier receiving an input signal. The multistage linear power amplifier comprises a plurality of Class-AB amplifiers connected in a cascade configuration. The plurality of Class-AB amplifiers amplifies the input signal to generate an amplified input signal. At least one of the plurality of Class-AB amplifiers is biased such that the multistage linear power amplifier emulates a Class-C amplifier.

21 Claims, 7 Drawing Sheets

DOHERTY AMPLIFIER

CROSS REFERENCE TO RELATED APPLICATION

This application is a continuation of U.S. application Ser. No. 13/710,765, filed on Dec. 11, 2012 and titled "Doherty Amplifier", which is hereby incorporated by reference in its entirety herein and which claims priority from the U.S. provisional application No. 61/576,243, titled "Composite Class C Doherty Peaking Amplifier", filed on Dec. 15, 2011, the disclosure of which is hereby incorporated by reference.

TECHNICAL FIELD

The presently disclosed embodiments are related, in general, to a power amplifier. More particularly, the presently disclosed embodiments are related to a Doherty power amplifier.

BACKGROUND OF THE INVENTION

Mobile communication systems require broad bandwidth and high linearity. Communications signals, used in such mobile communication systems, exhibit a high peak-to-average power ratio. Typical RF power amplifiers, that are used to amplify the communication signals, are operated at a large back-off power to satisfy the high peak-to-average power ratio and high linearity. Back-off corresponds to the difference between the increase in power of the output signal with the increase in power of the input signal. Typical RF amplifiers are described in conjunction with FIG. 1, FIG. 2, and FIG. 3.

Figure 1:
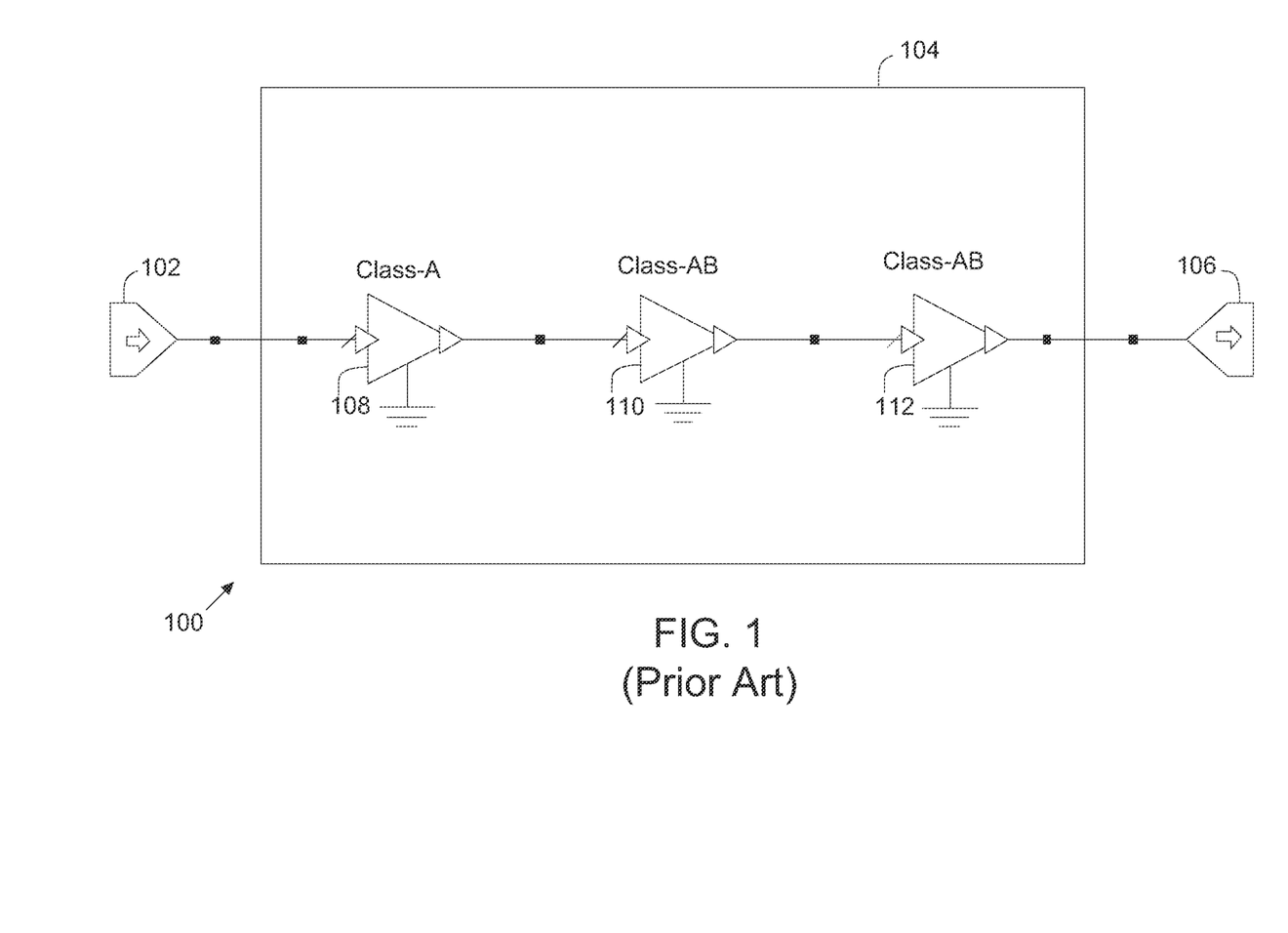
FIG. 1 is schematic diagram of a conventional multistage Class-AB power amplifier.

FIG. 1 is a schematic diagram of a conventional multistage Class-AB power amplifier 100. Multistage Class-AB power amplifier 100 includes an input port 102, a multistage amplifier 104, and an output port 106. Multistage amplifier 104 includes an input amplifier 108, a driver amplifier 110, and an output amplifier 112. In an embodiment, input amplifier 108 is Class-A biased, driver amplifier 110 and output amplifier 112 are Class-AB biased.

Input port 102 is connected to input amplifier 108. Input amplifier 108, driver amplifier 110 and output amplifier 112 are connected in a cascade configuration. Output amplifier 112 is connected to output port 106.

Multistage power amplifier 100 offers limited output power and limited power added efficiency. In order to improve the output power, two multistage power amplifiers 100 are connected in parallel to form a balanced amplifier configuration as described in conjunction with FIG. 2.

Figure 2:
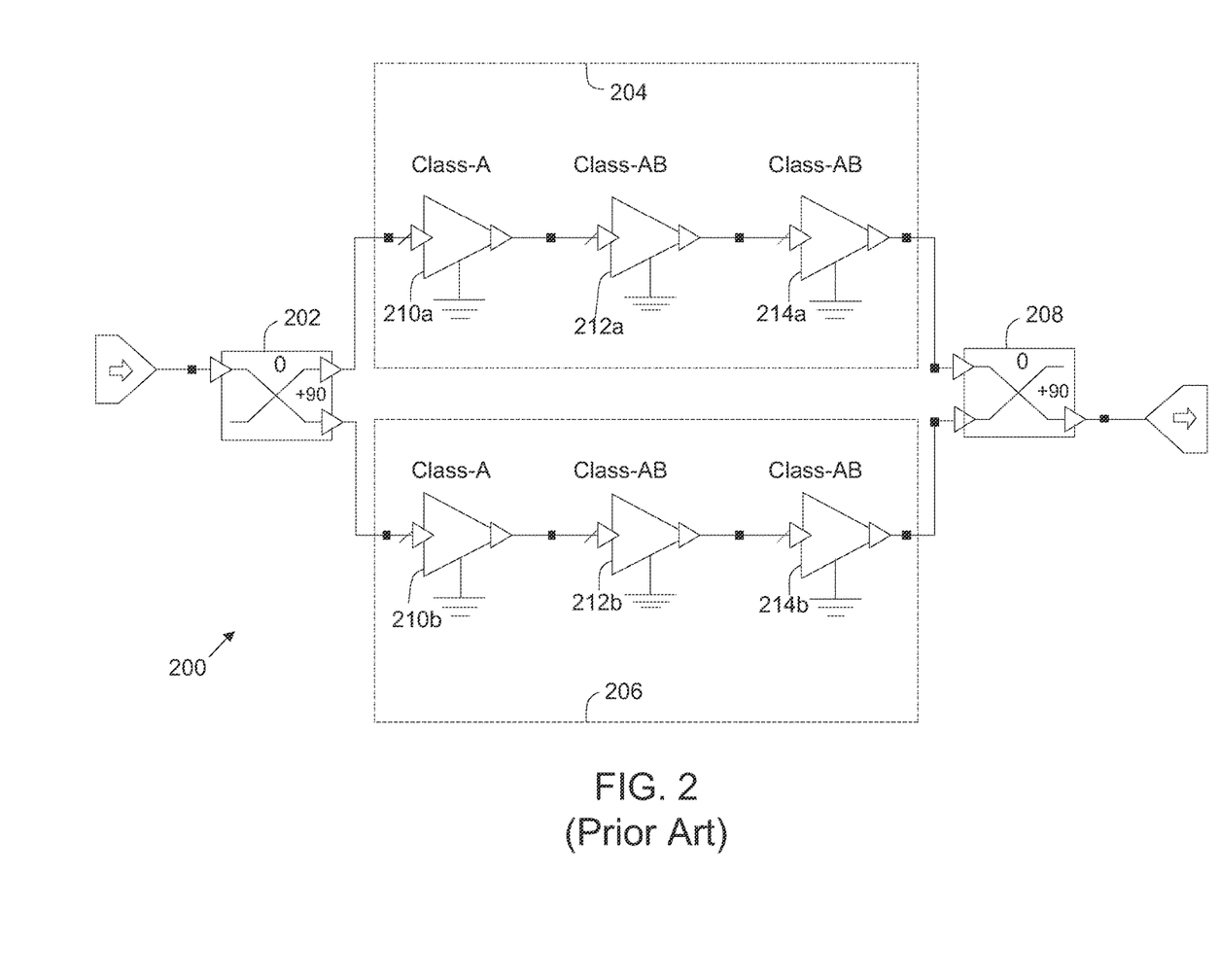
FIG. 2 is a schematic diagram of a conventional balanced amplifier.

FIG. 2 is a schematic diagram of a conventional balanced amplifier 200. Balanced amplifier 200 includes a first power splitter 202, a first multistage amplifier 204, a second multistage amplifier 206, and a second power splitter 208. First multistage amplifier 204 includes a first input amplifier 210a, a first driver amplifier 212a and a first output amplifier 214a. Second multistage amplifier 208 includes a second input amplifier 210b, a second driver amplifier 212b and a second output amplifier 214b.

The amplifier stages in first multistage amplifier 204 and second multistage amplifier 206 are biased in a similar manner as the amplifier stages in multistage amplifier 104 (refer to FIG. 1).

First power splitter 202 is connected to first input amplifier 210a and second input amplifier 210b. In first multistage amplifier 204, first input amplifier 210a, first driver amplifier 212a and first output amplifier 214a are connected in cascade configuration. Similarly, in second multistage amplifier 206, second input amplifier 210b, second driver amplifier 212b, and second output amplifier 214b are connected in cascade configuration. First output amplifier 214a and second output amplifier 214b are connected to second power splitter 208.

An input signal, applied at first signal splitter 202, is split in a first signal and a second signal. The first signal and second signal are 90 degrees out of phase. The first and second signals are then amplified by first multistage amplifier 204 and second multistage amplifier 206 respectively. The amplified first and second signals are combined by second signal splitter 208 to generate an output signal.

As the signal is split (i.e., into the first signal and second signal) and amplified individually, the output power is improved as compared to multistage Class-AB power amplifier 100. In an embodiment, balanced amplifier 200 produces approximately twice the output power as produced by multistage Class-AB power amplifier 100. In order to achieve further improvement in the usable output power and to also improve the power added efficiency, balanced amplifier 200 is modified to form a Doherty amplifier.

Figure 3:
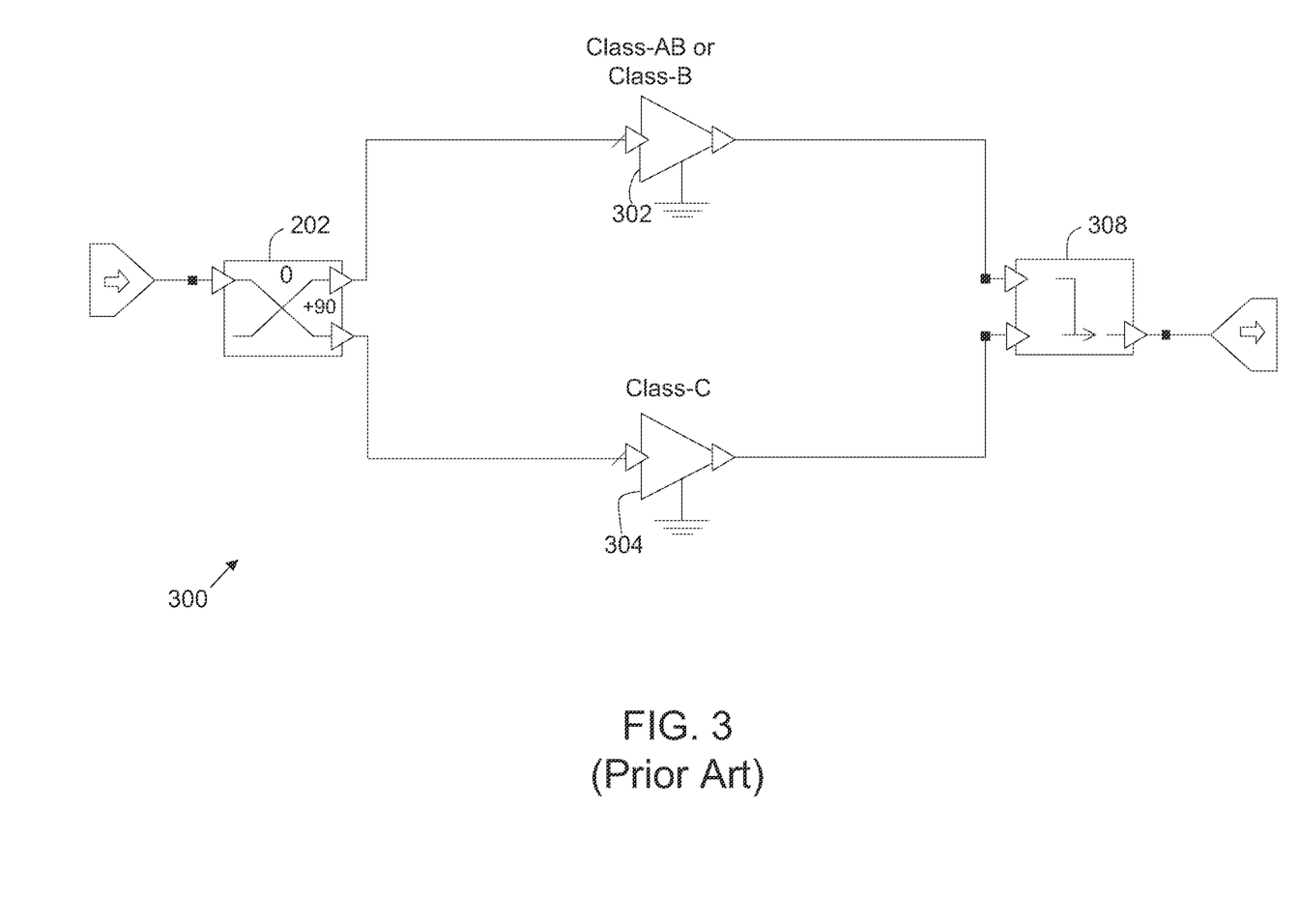
FIG. 3 is a schematic diagram of a conventional Doherty amplifier.

FIG. 3 is a schematic diagram of a convention Doherty amplifier 300. Doherty amplifier 300 includes a main amplifier 302, a peaking amplifier 304, and a Doherty combiner 308. Main amplifier 302 is Class B or Class AB biased. Peaking amplifier 304 is Class C biased. Further, it is known that Doherty amplifier 300 may also include more than one peaking amplifiers.

Doherty amplifier 300 achieves high efficiency at back-off through main amplifier 302 which operates into the high power added efficiency saturation region. Further, due to class-C biasing in peaking amplifier 304, peaking amplifier 304 supplies the signal peaks so that overall linearity can be restored. Additionally, the Doherty amplifier 300 achieves load modulation by using the principle of "load pulling" using two devices (i.e., main amplifier and peaking amplifier).

Main amplifier 302 operates when main amplifier 302 receives a low power input signal. As the power of the input signal increases, the Class-C amplifier (i.e., peaking amplifier 304) turns ON abruptly. Such abrupt turning ON of the Class-C amplifier leads to strong AM-AM distortion and AM-PM distortion. AM-AM distortion leads to undesired amplitude deviations while amplifying the peaks of the communication signal. Similarly, AM-PM leads to undesired phase deviations while amplifying the peaks of the communication signal. As most of the analog communication signals carry digital symbols, AM-AM distortion and AM-PM distortion may impede the ability to recognize the digital symbols leading to a distortion known as Error Vector Magnitude (EVM).

A person having ordinary skill in the art will understand that AM-AM distortions and AM-PM distortions in the output signal can be introduced due to various other factors such as the non-linear characteristics of amplifiers in the Doherty amplifier, and sudden gain compression and expansion in the amplifiers.

A person having ordinary skill in the art will also understand that the linearity degrades from Class-A to B and then to C while, in general, the current consumption decreases and power added efficiency (PAE) increases. Thus Class-A amplifier exhibits better linearity but at the cost of worse power added efficiency. Similarly, Class-C amplifier exhibits worse linearity but with the advantage of much improved power added efficiency. Such non-linear characteristics of Class-C amplifier introduce inter-modulation distortions among one or more input signals applied to the Doherty amplifier.

An addition to the distortions, most of the Doherty amplifiers are bulky as well as costly. Thus, such Doherty amplifiers may be unsuitable for various applications such as, but not limited to, active antenna systems, Femto cells, and mobile devices.

Thus, there is a need for an amplifier configuration that exhibits high power added efficiency and gain.

SUMMARY OF THE INVENTION

According to embodiments illustrated herein, there is provided a multistage linear power amplifier receiving an input signal. The multistage linear power amplifier includes a plurality of Class-AB amplifiers connected in a cascade configuration. The plurality of Class-AB amplifiers amplify the input signal to generate an amplified input signal. At least one of the plurality of Class-AB amplifiers is biased such that the multistage linear power amplifier emulates a Class-C amplifier.

According to embodiments illustrated herein, there is provided a Doherty amplifier. The Doherty amplifier includes a first multistage amplifier receiving an input signal. The first multistage amplifier further includes a first plurality of Class-AB amplifiers, connected in a cascade configuration. The first plurality of Class-AB amplifiers amplifies the input signal. The Doherty amplifier further includes a second multistage amplifier receiving a phase-shifted input signal. The second multistage amplifier includes a second plurality of Class-AB amplifiers, connected in the cascade configuration. The second plurality of Class-AB amplifiers amplifies the phase-shifted input signal. At least one of the second plurality of Class-AB amplifiers is biased such that the second multistage amplifier emulates a Class-C amplifier.

Since the main amplifier is a linear multi-stage AB amplifier, the main amplifier exhibits good linear operation in the low power region. Further, since the peaking amplifier is a linear multi-stage AB amplifier, the peaking amplifier exhibits the lessened distortion behavior of AB Class as opposed to the more severe and abrupt turn-on and distortion of Class-C. Thus, overall distortion is reduced in comparison to the prior art with Class-C peaking amplifier.

BRIEF DESCRIPTION OF DRAWINGS

The following detailed description of the embodiments of the present invention will be better understood when read in conjunction with the appended drawings. The present invention is illustrated by way of example, and not limited by the accompanying figures, in which like references indicate similar elements.

DETAILED DESCRIPTION OF THE PREFERRED EMBODIMENTS

The invention can be best understood with reference to the detailed figures and description set forth herein. Various embodiments are discussed below with reference to the figures. However, those skilled in the art will readily appreciate that the detailed description given herein with respect to these figures is simply for explanatory purposes. The disclosed systems or circuits extend beyond the described embodiments. For example, those skilled in the art will appreciate that in light of the teachings presented, multiple alternate and suitable approaches may be realized, to implement the functionality of any detail described herein, beyond the particular implementation choices in the following embodiments described and shown.

Definitions

The following terms shall have, for the purposes of this application, the respective meanings set forth below.

"Heavy Class-AB biasing" refers to 50% or more of Class-A (close to Class-A) biasing.

"Low Class-AB biasing" refers to 20% or below of Class-A (close to Class-B) biasing. Further, Low Class-AB biasing is divided into "Very Deep Class-AB biasing" (below 4% of Class-A biasing) and "Deep Class-AB biasing" (between 4% and 10% of Class-A biasing).

"Mid Range Class-AB biasing" refers to a range between "Low Class-AB biasing" and "Heavy Class-AB biasing" (i.e., above 20% and below 50% of Class-A biasing).

A person having ordinary skill in the art will understand that there exists a continuum of an infinite number of possible bias points between Class-A and Class-B. For the purposes of explanation and readability, descriptive terms have been defined to distinguish different regions of Class-AB biasing. A person having ordinary skill in the art will readily recognize that these are only descriptive terms and will further understand that the appropriate biasing point in the Class-AB continuum is dependent on a wide variety of factors and design/performance trade-offs including, but not limited, to the particular signal characteristics, product application, and the particular semiconductor technology/device technology.

Figure 4:
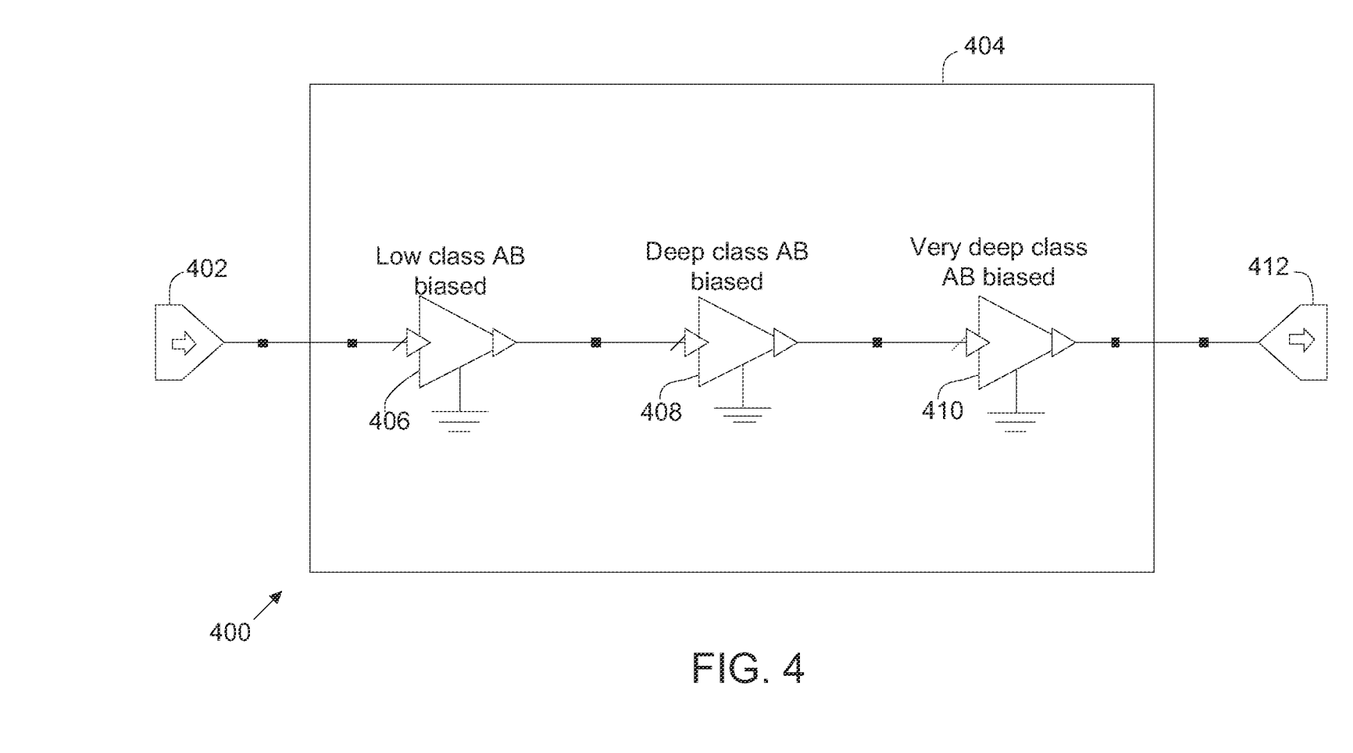
FIG. 4 is a schematic diagram depicting a multistage linear power amplifier in accordance with an embodiment of the invention.

FIG. 4 is a schematic diagram depicting a multistage linear power amplifier 400 in accordance with an embodiment of the invention. Multistage linear power amplifier 400 includes an input port 402, a multistage amplifier 404, and an output port 412. Multistage amplifier 404 further includes a first Class-AB amplifier 406, a second Class-AB amplifier 408, and a third Class-AB amplifier 410. In an embodiment, input port 402 is connected to first Class-AB amplifier 406 of multistage amplifier 404. First Class-AB amplifier 406, second Class-AB amplifier 408, and third Class-AB amplifier 410 are connected in a cascade configuration to form multistage amplifier 404. Third Class-AB amplifier 410 is connected to output port 412.

In an embodiment, first Class-AB amplifier 406, second Class-AB amplifier 408, and third Class-AB amplifier 410 are configured as an input stage, a driver stage, and an output stage of multistage amplifier 404, respectively. A person having ordinary skill in the art will understand that scope of the invention is not limited to having three stages in multistage amplifier 404. In an embodiment, numbers of amplifier stages may be determined based on gain requirement of multistage amplifier 404.

In an embodiment, first Class-AB amplifier 406 (input or pre-driver stage) is low Class-AB biased. Second Class-AB amplifier 408 (driver stage) is deep Class-AB biased. Third Class-AB amplifier 410 (or output stage) is very deep Class-AB biased. A person having ordinary skill in the art will understand that the biasing of first Class-AB amplifier 406, second Class-AB amplifier 408, and third Class-AB amplifier 410 may vary based upon many factors such as the application in which multistage amplifier 404 is to be used and the particular semiconductor technology.

U.S. Pat. No. 6,515,546, and assigned to the same assignee (Anadigics Inc), which is herein incorporated by reference in its entirety, discloses an exemplary biasing network that can be utilized for biasing first Class-AB amplifier 406, second Class-AB amplifier 408, and third Class-AB amplifier 410. However, the scope of the invention should not be limited to the bias network of U.S. Pat. No. 6,515,546.

The operation of the multistage linear power amplifier 400 is described later in conjunction with FIG. 5.

Figure 5:
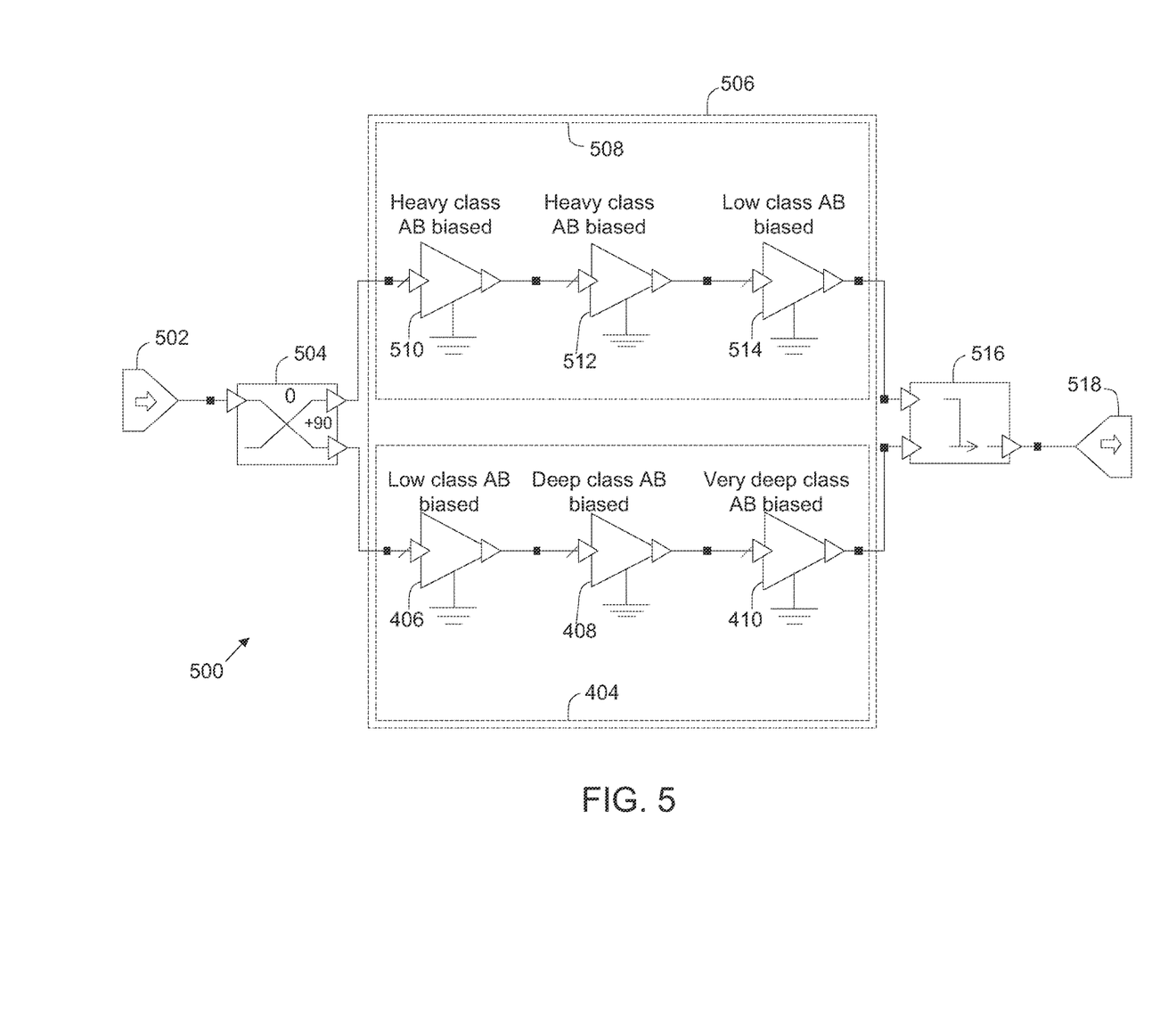
FIG. 5 is a schematic diagram depicting a Doherty amplifier in accordance with an embodiment of the invention.

FIG. 5 is a schematic diagram depicting a Doherty power amplifier 500 in accordance with an embodiment of the invention. Doherty power amplifier 500 is explained in conjunction with FIG. 4. Doherty power amplifier 500 includes an input port 502, a signal splitter 504, a Doherty amplifier 506, a Doherty combiner 516, and an output port 518. Doherty amplifier 506 includes multistage amplifier 404 and a main amplifier 508. Multistage amplifier 404 includes first Class-AB amplifier 406, second Class-AB amplifier 408, and third Class-AB amplifier 410. Main amplifier 508 includes a fourth Class-AB amplifier 510, a fifth Class-AB amplifier 512, and a sixth Class-AB amplifier 514. Hereinafter, multistage amplifier 404 has been referred as peaking amplifier 404.

For the purpose of the ongoing description, three amplifier stages have been considered for main amplifier 508. However, it will be apparent to a person having ordinary skill in the art that the number of amplifier stages in main amplifier 508 may vary based on the gain requirement of main amplifier 508. For example, if a plurality of amplifiers stages in main amplifier 508 includes two amplifier stages i.e., a fourth Class-AB amplifier 510 and a fifth Class-AB amplifier 512, then fourth Class-AB amplifier 510 is configured as the driver stage of main amplifier 508 and fifth Class-AB amplifier 512 is configured as the output stage of main amplifier 508.

Input port 502 is connected to signal splitter 504. Signal splitter 504 is connected to fourth Class-AB amplifier 510 and first Class-AB amplifier 406. First Class-AB amplifier 406, second Class-AB amplifier 408, and third Class-AB amplifier 410 are connected in a cascade configuration to form peaking amplifier 404. Similarly, fourth Class-AB amplifier 510, fifth Class-AB amplifier 512, and sixth Class-AB amplifier 514 are connected in the cascade configuration to form main amplifier 508. Sixth Class-AB amplifier 514 and third Class-AB amplifier 410 are connected to Doherty combiner 516. Doherty combiner 516 is further connected to output port 518.

In an embodiment, fourth Class-AB amplifier 510 (input or pre-driver stage of main amplifier 508) is heavy Class-AB biased. Fifth Class-AB amplifier 512 (driver stage of main amplifier 508) is heavy Class-AB biased. Sixth Class-AB amplifier 514 (output stage of main amplifier 508) is low Class-AB biased. In an embodiment, peaking amplifier 404 is constructed as an identical fabricated copy of the main amplifier 508 but with differing biasing. First Class-AB amplifier 406, second Class-AB amplifier 408, and third Class-AB amplifier 410 are biased as described above in conjunction with FIG. 4.

Input port 502 receives the input signal from an external source (not shown). The input signal is transmitted to signal splitter 504. In an embodiment, signal splitter 504 is a 90 degree hybrid power splitter. Signal splitter 504 splits the input signal into a first signal and a second signal. In an embodiment, the first signal and the second signal have equal power (e.g., 3 dB). Further, the first signal and the second signal have a 90 degree phase difference. The first signal and the second signal are transmitted to fourth Class-AB amplifier 510 and first Class-AB amplifier 406.

For the purpose of ongoing description, it is assumed that Doherty power amplifier 500 achieves peak efficiency at 6 db back-off (i.e., the difference between the increase in power of the output signal with the increase in power of the input signal). However, the scope of the invention is not to be limited to achieving peak efficiency at 6 db back-off. A person having ordinary skill in the art will understand that peak efficiency of Doherty power amplifier 500 can be achieved at a different back-off value other than a 6 db back-off.

Figure 6:
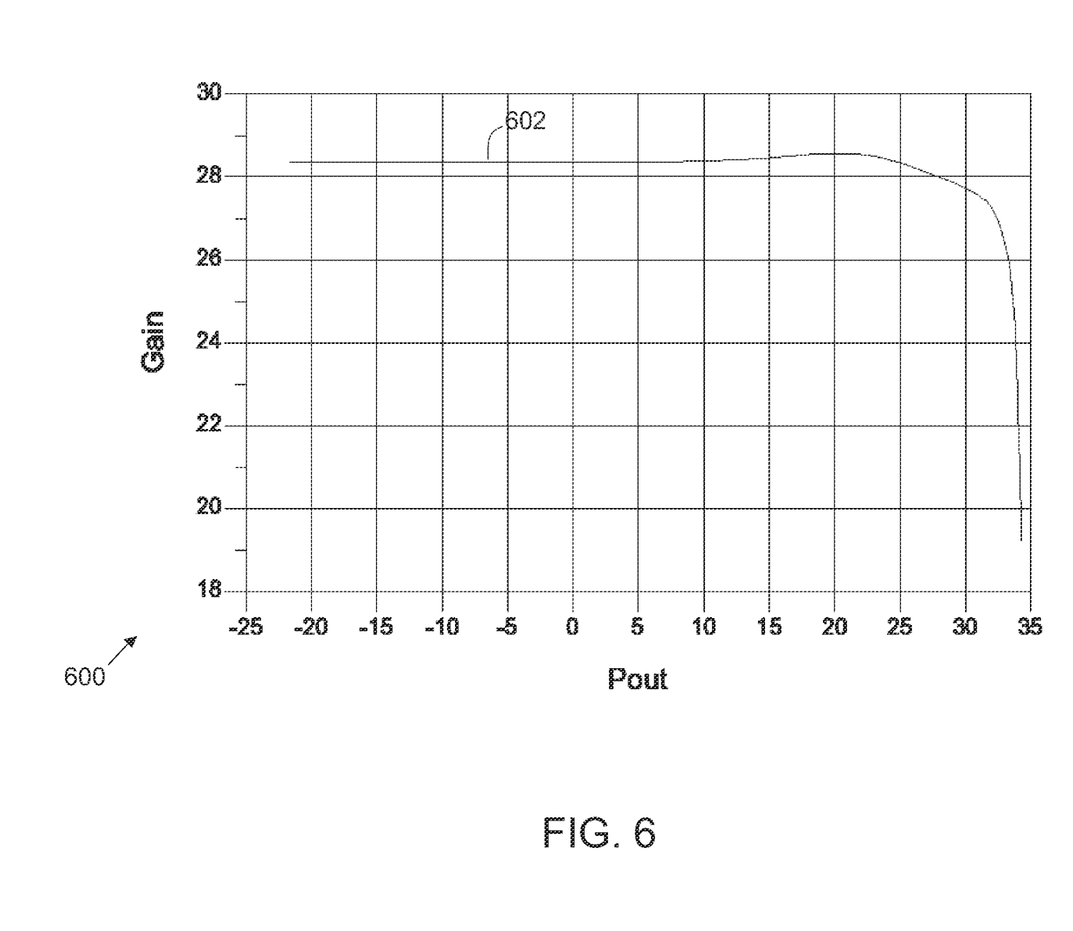
FIG. 6 is a graph illustrating variation in gain of a main amplifier with respect to the output power in accordance with an embodiment of the invention.

For instance, if the input signal is a low power signal (below 6 db back-off), the first signal and the second signal generated by signal splitter 504 will also be low power signals. As the first signal is a low power signal, main amplifier 508 operates in an ON state due to the biasing of fourth Class-AB amplifier 510, fifth Class-AB amplifier 512, and sixth Class-AB amplifier 514. Further, main amplifier 508 exhibits constant gain as a function of power. FIG. 6 illustrates a graph 600 showing the variation of gain of main amplifier 508 with increasing power of the input signal. From the curve 602, it is observed that the gain of main amplifier 508 is constant with increasing power of the input signal. Therefore, for low power signals, main amplifier 508 outputs a linear amplified replica of the first signal received from signal splitter 504.

Figure 7:
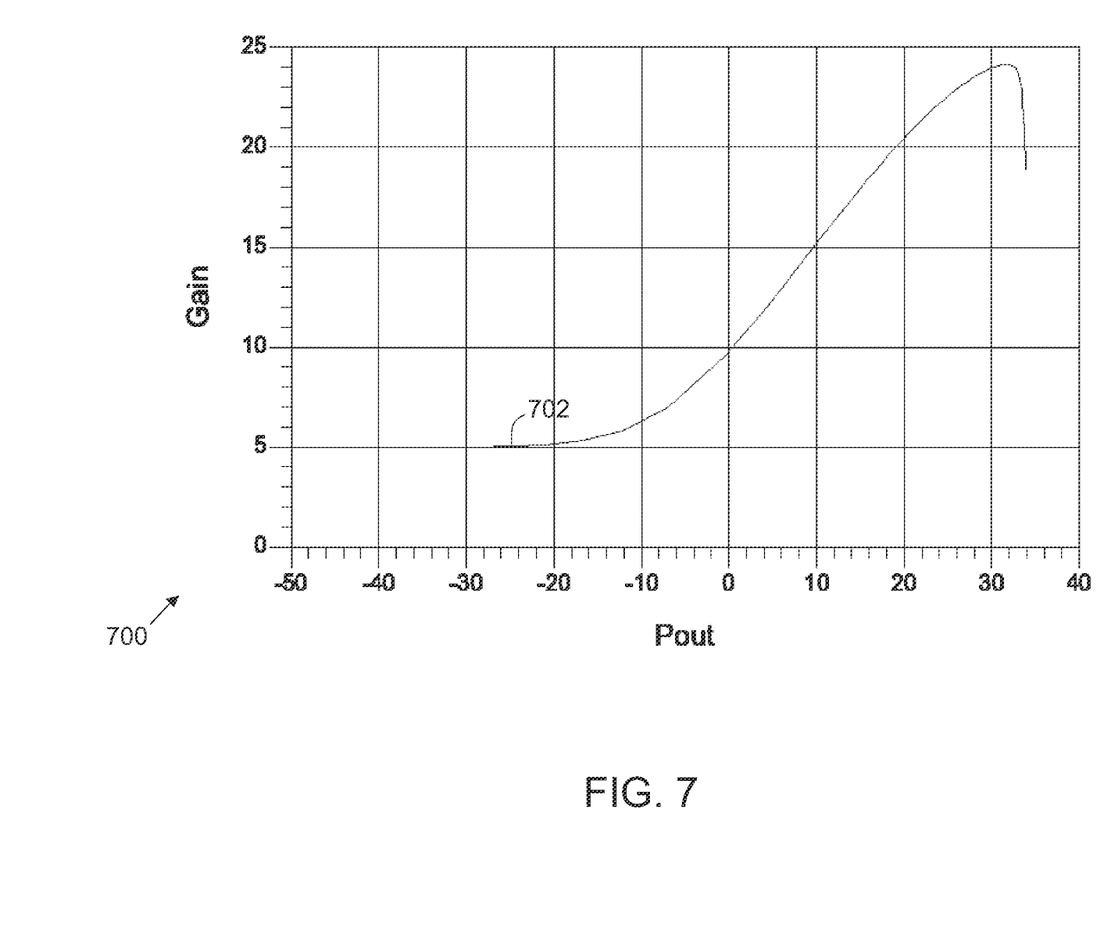
FIG. 7 is a graph illustrating variation in gain of a peaking amplifier with respect to the output power in accordance with an embodiment of the invention.

On the other hand, as the second signal is a low power signal and first Class-AB amplifier 406 is low Class-AB biased, the gain of first Class-AB amplifier 406 for a low power signal is very low in comparison to the gain of main amplifier 508. FIG. 7 illustrates a graph 700 showing the variation of gain of peaking amplifier 404 with increasing power of the amplified second signal. From the curve 702, it is observed that peaking amplifier 404 exhibits significantly reduced gain under back off due to the described biasing. Thus, the output of peaking amplifier 404 is a much smaller amplified replica of the second signal in comparison to output of main amplifier 508. Further, the current consumption of peaking amplifier 404 is small (due to low bias currents). Therefore, peaking amplifier 404 emulates the behavior of a Class-C amplifier in a Doherty amplifier configuration (i.e., providing negligible output when a low power signal is applied).

Additionally, for low power input signals, as output of peaking amplifier 404 is negligible, peaking amplifier 404 provides negligible load modulation emulating the effect of a Class-C peaking amplifier that offers an open circuit to Doherty combiner 516. Therefore, the load presented to the main amplifier 508 approaches twice that of optimum output load impedance. In an embodiment, the optimum load impedance for main amplifier 508 and peaking amplifier 404 is 50 ohms.

As the power of the input signal increases (region between 0 db and 6 db back-off), peaking amplifier 404 exhibits smooth gain expansion (due to the self biasing of first Class-AB amplifier 406, second Class-AB amplifier 408 and third Class-AB amplifier 410). From curve 702, it can be observed that the gain of peaking amplifier 404 increases smoothly with increase in the power of the input signal. The smooth increase in the gain of peaking amplifier 404, leads to smoother AM-AM and AM-PM distortion characteristics with the absence of sudden changes or discontinuities.

Additionally, as the power of the input signal increases the efficiency of main amplifier 508 reaches a peak and the gain of peaking amplifier 404 starts increasing. Due to the increase in the gain of peaking amplifier (in the region between 0 dB and 6 dB back-off), the parallel connection of the main and peaking amplifier 404 across the load through Doherty combiner 516 results in load modulation.

As power of the input signal increases, the power of the first signal and the second signal (generated by signal splitter 504) also increases. As the power of the first signal and second signal increases, the gain and output power of peaking amplifier 404 both rises until both the peaking amplifier 404 and the overall Doherty amplifier 506 reaches saturation and peak power added efficiency at the zero back-off condition. As main amplifier 508 and peaking amplifier 404 are driven into the saturation region, the gain of main amplifier 508 and peaking amplifier 404 is reduced. From curves 602 and 702, it is seen that the gain of main amplifier 508 and peaking amplifier 404 shows a dip after 30 db power of the output signal.

Post the amplification, signal combiner 508 combines the amplified second signal and the amplified first signal to generate an output signal. The out signal is outputted from output port 518.

A person having ordinary skill in the art will understand that single peaking amplifier 404 in Doherty amplifier 500 has been shown for illustrative purposes. In an embodiment, Doherty amplifier 500 may include more than one peaking amplifiers connected in parallel with main amplifier 508. Various such Doherty amplifier configurations having more than one peaking amplifiers have been disclosed in the U.S. patent application Ser. No. 13/548,774, filed Jul. 10, 2012 entitled "INTEGRATED OUTPUT COMBINER FOR AMPLIFIER SYSTEM", assigned to the same assignee (ANADIGICS, INC.), which is herein incorporated by reference in its entirety. It should be apparent to a person having ordinary skill in the art that the biasing as disclosed in various embodiments of the present invention can be applied to the one or more peaking amplifiers to achieve further improvements.

The embodiments of the present invention provide several advantages. As main amplifier 508 and peaking amplifier 404 include a plurality of Class-AB amplifiers, main amplifier 508 and peaking amplifier 404 can be constructed as identical fabricated copies. Constructing identically fabricated copies of main amplifier and peaking amplifier prevents the problems caused by manufacturing/process variations due to the inherent matching of MMIC (Monolithic microwave integrated circuit) dies fabricated side by side on a semiconductor wafer. Identically fabricated copies leads to closely matched gain and phase in the Doherty power amplifier containing two (or more) multistage amplifier paths without the use of costly and space consuming circuitry for calibration or compensation of the gain and phase balance. The conversion of an existing linear multistage amplifier into a Doherty-like amplifier has strong positive business and manufacturing implications such as time to market, stability over temperature range and relative immunity to process/manufacturing variation. In addition, this technique enables an existing linear amplifier to be converted to a Doherty power amplifier with higher power and higher efficiency. Further, peaking amplifier 404 exhibits a smoother gain expansion in comparison to sudden turn-on in Class-C amplifier (as used in the prior art). Therefore, distortions, such as the AM-AM distortion and the AM-PM distortion, due to sudden turn-on are reduced.

While various embodiments of the present invention have been illustrated and described, it will be clear that various multistage amplifiers (the main amplifier and one or more peaking amplifiers) of the Doherty amplifier can be fabricated as a single integrated circuit, or as discrete circuit components connected together. Further, various other possible combinations of electronic components of the multistage amplifiers may also be used without departing from the scope of the invention.

While various embodiments of the present invention have been illustrated and described, it will be clear that the invention is not limited to these embodiments only. Numerous modifications, changes, variations, substitutions and equivalents will be apparent to those skilled in the art, without departing from the basic scope and spirit of the invention, as described in the claims that follow.

What is claimed is:

1. A multistage power amplifier comprising:
a plurality of amplifiers biased within a bias range associated with a first class of amplifier, the plurality of amplifiers connected in a cascade configuration and configured to amplify an input signal to generate an amplified input signal, at least one of the plurality of amplifiers biased within the bias range is biased within a first portion of the bias range and at least one other of the plurality of amplifiers biased within the bias range is biased within a second portion of the bias range that differs from the first portion of the bias range such that the multistage power amplifier emulates a behavior of an amplifier of a second class while each of the plurality of power amplifiers is biased within the bias range associated with the first class of amplifier.

2. The multistage power amplifier of claim 1 wherein amplifiers of the first class exhibit greater linearity than amplifiers of the second class.

3. The multistage power amplifier of claim 2 wherein amplifiers of the second class exhibit greater power added efficiency than amplifiers of the first class.

4. The multistage power amplifier of claim 1 wherein the plurality of amplifiers include at least a first amplifier configured as an input stage, a second amplifier configured as a driver stage, and a third amplifier configured as an output stage.

5. The multistage power amplifier of claim 1 wherein the plurality of amplifiers operate as a peaking amplifier to amplify peaks in the input signal.

6. A Doherty power amplifier comprising:
a first multistage power amplifier receiving an input signal, the first multistage power amplifier including a first plurality of amplifiers of a first class, the first plurality of amplifiers connected in a cascade configuration; and
a second multistage power amplifier receiving a phase-shifted input signal obtained by phase shifting the input signal, the second multistage power amplifier including a second plurality of amplifiers biased within a bias range associated with the first class of amplifier, the second plurality of amplifiers connected in a cascade configuration and configured to amplify the phase-shifted input signal, at least one of the second plurality of amplifiers is biased within the bias range biased within a first portion of the bias range and at least one other of the plurality of amplifiers biased within the bias range is biased within a second portion of the bias range that differs from the first portion of the bias range such that the second multistage power amplifier emulates a behavior of an amplifier of a second class while each of the plurality of power amplifiers is biased within the bias range associated with the first class of amplifier.

7. The Doherty power amplifier of claim 6 wherein amplifiers of the first class exhibit greater linearity than amplifiers of the second class.

8. The Doherty power amplifier of claim 7 wherein amplifiers of the second class exhibit greater power added efficiency than amplifiers of the first class.

9. The Doherty power amplifier of claim 6 further comprising a signal combiner configured to combine an amplifier input signal output by the first multistage power amplifier and the amplifier phase-shifted input signal output by the second multistage power amplifier.

10. The Doherty power amplifier of claim 6 wherein the first multistage power amplifier operates as a main amplifier to amplify the input signal.

11. The Doherty power amplifier of claim 6 wherein the second multistage power amplifier operates as a peaking amplifier to amplify peaks in the phase-shifted input signal.

12. The Doherty power amplifier of claim 6 wherein at least the first plurality of amplifiers or the second plurality of amplifiers includes at least three amplifiers.

13. A Doherty power amplifier comprising:
a signal splitter configured to split an input signal into a first input signal and a second input signal;
a first multistage power amplifier including a first plurality of amplifiers of a first class and configured to amplify the first input signal; and
a second multistage power amplifier including a second plurality of amplifiers biased within a bias range associated with the first class of amplifier and configured to amplify the second input signal, at least one of the second plurality of amplifiers biased within the bias range is biased within a first portion of the bias range and at least one other of the plurality of amplifiers biased within the bias range is biased within a second portion of the bias range that differs from the first portion of the bias range such that the second multistage power amplifier emulates a behavior of an amplifier of a second class while each of the plurality of power amplifiers is biased within the bias range associated with the first class of amplifier.

14. The Doherty power amplifier of claim 13 further comprising a power combiner configured to combine the amplified first input signals and the amplified second input signal to generation an output signal.

15. The Doherty power amplifier of claim 13 wherein the first multistage amplifier and the second multistage amplifier are implemented the same.

16. The Doherty power amplifier of claim 15 wherein the first multistage amplifier is biased differently than the second multistage amplifier.

17. The Doherty power amplifier of claim 13 wherein amplifiers of the first class exhibit greater linearity than amplifiers of the second class and amplifiers of the second class exhibits greater power added efficiency than amplifiers of the first class.

18. The Doherty power amplifier of claim 13 wherein the second multistage power amplifier operates as a peaking amplifier to amplify peaks in the phase-shifted input signal.

19. The multistage power amplifier of claim 1 wherein at least one other of the plurality of amplifiers biased within the bias range is biased within a third portion of the bias range that differs at least in part from the first portion and second portion of the bias range.

20. The Doherty power amplifier of claim 6 wherein at least one other of the plurality of amplifiers biased within the bias range is biased within a third portion of the bias range that differs at least in part from the first portion and second portion of the bias range.

21. The Doherty power amplifier of claim 13 wherein at least one other of the plurality of amplifiers biased within the bias range is biased within a third portion of the bias range that differs at least in part from the first portion and second portion of the bias range.

* * * * *